United States Patent [19]

Kuniyoshi et al.

[11] 4,380,395
[45] Apr. 19, 1983

[54] REDUCTION PROJECTION ALIGNER SYSTEM

[75] Inventors: Shinji Kuniyoshi, Tokyo; Akihiro Takanashi; Toshiei Kurosaki, both of Kokubunji, all of Japan

[73] Assignee: Hitachi, Ltd., Tokyo, Japan

[21] Appl. No.: 152,844

[22] Filed: May 23, 1980

[30] Foreign Application Priority Data

Jun. 4, 1979 [JP] Japan ............................ 54-69771

[51] Int. Cl.³ ............................................ G01B 11/27
[52] U.S. Cl. ............................................ 356/401
[58] Field of Search .............. 356/399, 400, 401, 375, 356/150

[56] References Cited

U.S. PATENT DOCUMENTS

| | | | |
|---|---|---|---|
| 3,649,121 | 3/1972 | Holtz | 356/399 |
| 3,941,980 | 3/1976 | Okamoto et al. | 356/400 |
| 3,943,359 | 3/1976 | Matsumoto et al. | 356/401 |
| 4,045,141 | 8/1977 | Moriyama et al. | 356/401 |
| 4,115,762 | 9/1978 | Akiyama | 250/201 |
| 4,153,371 | 5/1979 | Koizumi et al. | 356/401 |

FOREIGN PATENT DOCUMENTS 5228347  3/1977  Japan ............................ 356/375

*Primary Examiner*—R. A. Rosenberger
*Attorney, Agent, or Firm*—Antonelli, Terry & Wands

[57] ABSTRACT

In a reduction projection aligner system wherein a pattern on a reticle is formed directly on a wafer by reducing, projecting and printing it, a positioning pattern on the wafer is optically magnified and projected and then focused onto a focal plane where a slit scans the projected image. The distance from a mechanical origin provided on the supporting body of the system to the positioning pattern on the wafer is then measured on the basis of the movement of the slit, and the reticle is then relatively moved and positioned so as to coincide with the position of the wafer relative to the body of the system, thereby bringing the wafer and the reticle into coincidence.

5 Claims, 5 Drawing Figures

REDUCTION PROJECTION ALIGNER SYSTEM

BACKGROUND OF THE INVENTION

This invention relates to improvements in a reduction projection aligner system for use in semiconductor production.

The reduction projection aligner system is typically used for semiconductor production and forms the patterns of semiconductor integrated circuits, such as ICs and LSIs, directly on wafers. In many conventional reduction projection aligner systems, the wafer and a reticle (a glass plate on which an original pattern is depicted) are positioned independently of each other. More specifically, the reticle is positioned by visually detecting two typical portions on the reticle with a reticle positioning optical microscope and is fixed onto the body of the apparatus, while the wafer is positioned by visually detecting two typical portions on the wafer with a wafer positioning optical microscope and is fixed onto the same body. With the method in which the whole wafer is positioned on the basis of the two typical portions on the wafer in this manner, the precision of the alignment between the reticle and the wafer depends principally on the positioning precision of the wafer, which forms a serious hindrance to the enhancement of the alignment precision. In addition, it is impossible to align the reticle and the wafer if an error in the arrangement of the pattern on the wafer attributed to the anisotropic expansion or contraction of the wafer occurs during the manufacturing of the wafer.

Therefore, in order to eliminate such disadvantages and to make high precision alignment of both the reticle and the wafer possible, there has been devised a method as shown in FIG. 1 wherein the position of a wafer is relatively detected through a reticle as well as a reduction lens (refer to Japanese patent application Laid Open No. 54-93974).

In the reduction projection aligner system shown in FIG. 1, a pattern to be used for positioning is formed on the wafer 4 by a preceding step and this pattern is illuminated by a light guide 7 through a reference pattern 5 formed on an edge of the reticle 2 and further through a reduction lens 3. Using the reflected light from the wafer 4, the positioning pattern on the wafer 4 is focused on the reticle 2. On the other hand, in order to detect the position of the reticle 2, the reference pattern 5 on the reticle 2 is illuminated by a light guide 6. Thus, the reflected lights from the wafer 4 and the reticle 2 are projected onto the position occupied by a slit 10 by means of a magnifying optical system 9, the distance of movement of the slit 10 is measured by a uniaxial movable table 12 and a measuring machine 13, and the output from a photo-detector 11 corresponding to the position of the slit 10 is detected, whereby the relative positions of the reticle 2 and the wafer 4 are detected.

With this system, however, the predetermined reference pattern 5 needs to be formed in a specified position on the reticle 2 separately from a circuit pattern carried by the reticle and a reticle positioning pattern which is used for positioning the reticle 2 with respect to a holder 14. This provision of the reference pattern 5 forms a serious hindrance in preparing the reticle. Moreover, any arrangement error of the reference pattern 5 with respect to the circuit pattern on the reticle results in an alignment error between the reticle 2 and the wafer 4. Further, since the relative positions of the reticle 2 and the wafer 4 are detected, an optical system for illuminating the reticle surface which consists of the light guide 6 and a mirror 8 must be installed; however, such installation is very difficult in practice. In the figure, numeral 1 designates a condensing lens in the primary optical path of the system.

SUMMARY OF THE INVENTION

This invention has been made in view of the above drawbacks, and has for its object to provide a reduction projection aligner system in which a positioning pattern on a wafer obtained through a reduction lens is detected by the use of a detecting optical system which is easy to install, thereby to permit a high precision detection of the wafer position relative to the body of the system.

In order to accomplish the stated object, according to this invention, in a reduction projection aligner system which forms the patterns of semiconductor integrated circuits, such as ICs and LSIs, directly on wafers, when a pattern on a wafer already formed by a preceding step and a pattern to be formed anew are to be aligned, the positioning pattern on the wafer is optically magnified and projected and then focused, the focal plane is scanned by a slit having its mechanical origin on the body of the system, the brightness of light passing through the slit is photoelectrically converted in correspondence with movement of the slit, and the distance from the mechanical origin of the slit to the positioning pattern of the wafer is measured, thereby to calculate the position of the wafer relative to the body of the reduction projection aligner system, and a reticle having the pattern to be formed anew is relatively moved so as to coincide with the wafer, to execute the so-called alignment of the reticle.

DETAILED DESCRIPTION OF THE PREFERRED EMBODIMENTS

Hereunder, this invention will be described in detail with reference to various exemplary embodiments.

Figure 1:
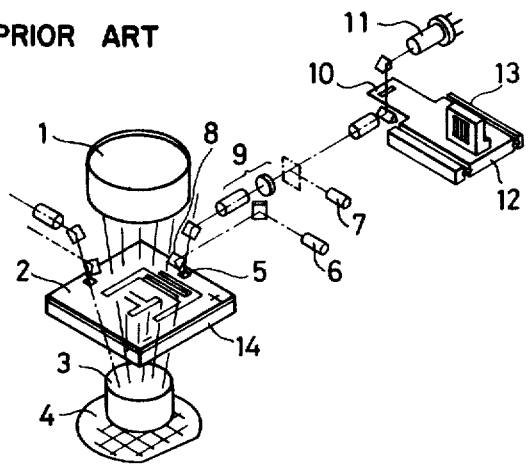
FIG. 1 is a diagrammatic view of a reduction projection aligner system of a type already proposed.
Figure 2:
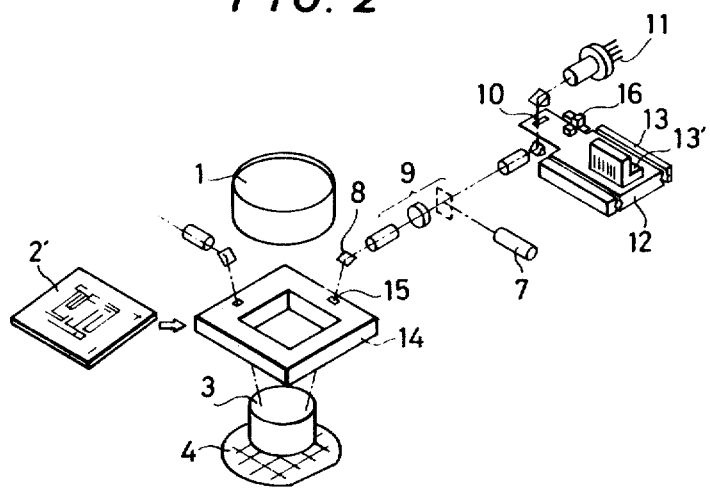
FIG. 2 is a diagrammatic view of an embodiment of this invention.

A conceptual diagram of a reduction projection aligner system according to this invention is shown in FIG. 2. The system of this invention greatly differs from the system shown in FIG. 1 in the following points. A part of the holder 14 which serves to carry a reticle 2' thereon is provided with a hole 15 so as to illuminate a pattern on the wafer 4 by light projected from the light guide 7 through the reduction projection lens 3 similarly to the system shown in FIG. 1. Therefore, a reticle 2' to be placed on the holder 14 does not need to be provided with the special reference mark 5 as shown in FIG. 1, and it may merely have a structure adapted to transmit light through the edge thereof. Further, elimination of the special reference mark 5 means that the light guide 6 for illuminating the reference mark 5 is unnecessary, and one mirror 8' suffices in this system. In addition, the pattern (for example, a rectilinear mark usually having a width of 6 μm or so) on the wafer as focused on the reticle is projected onto the position of the slit 10 through the optical system 9. At this time, by means of an origin sensor 16 disposed in the movable range of the slit 10, the distance from the origin of the slit 10 to the positioning pattern of the wafer is measured by the measuring machine 13. The origin sensor 16 is fixed on the body of the system, so that the distance of movement of the slit to the positioning pattern on the wafer after the slit has passed through the origin sensor 16 is gauged as the position of the wafer relative to the body of the system.

Figure 3:
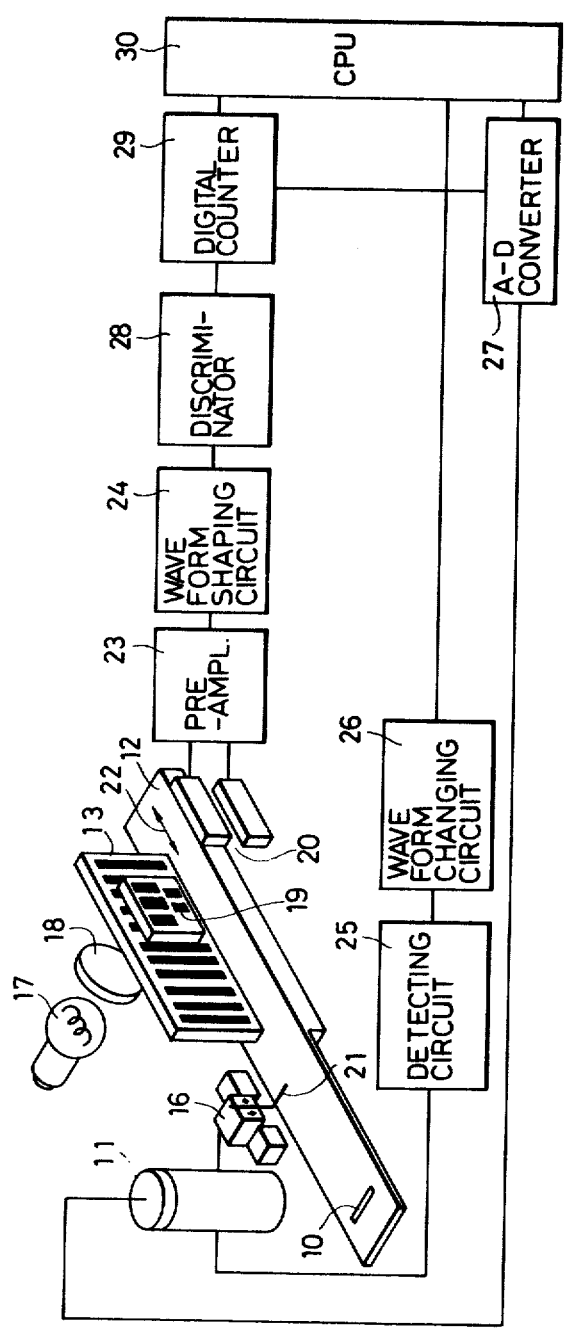
FIG. 3 is a diagrammatic view showing the details of a pattern detecting portion.

The details of the pattern detecting portion are shown in FIG. 3. On the uniaxial movable table 12, there are placed the slit 10, a member to-be-detected 21 for the original sensor 16, and a glass scale 13'. The glass scale 13' is movable only in the direction of arrow 22 with the movement of the uniaxial movable table 12. An index scale 19 is fixed at a predetermined spacing with respect to the glass scale 13'. The glass scale 13' and the index scale 19 are overlaid with gratings at equal spacings, and they are sandwiched inbetween a light source 17 and lens 18, on the one hand, and a photodetector 20, on the other hand. Light projected from the light source 17 towards the photodetector 20 repeats in brilliance and darkness each time the gratings of the glass scale 13' move one pitch with respect to the index scale 19, and this modulated light is taken out as a sinusoidal signal. Since the output signal from the photodetector 20 is feeble as it is, it is amplified by a preamplifier 23. Further, the amplified signal is passed through a waveform shaping circuit 24, as well as a direction discriminator 28, and is indicated as a digital quantity by a digital counter 29. On the other hand, as the origin sensor 16, there is employed by way of example a magnetic tranducer which applies the principle of magnetic recording. When the magnetic conductor 21 which is the member to-be-detected placed on the movable table 12 moves in the sense of the arrow 22, an analog output of, for example, about 1 mV/μm is produced via the magnetic transducer 16 as well as a detecting circuit 25, and it is turned into a pulse output by a waveform changing circuit 26. Herein, the system is operated under the condition that the spacing between the magnetic transducer 16 and the magnetic conductor 21 is set at, for example, below 0.5 mm. Thus, when the magnetic conductor 21 placed on the movable table 12 passes in front of the magnetic transducer 16, a pulse output is obtained at a reproduction precison of approximately 1 μm.

On the other hand, the brilliance and darkness of the light which has passed through the slit is photoelectrically converted by the photomultiplier 11, the output of which is applied to an analog-to-digital converter 27. The A-D converter 27 digitizes the photomultiplier output in synchronism with the counter output from the digital counter 29, and applies the digital signal to a central processing unit 30. After having received the pulse output from the magnetic transducer 16, the CPU 30 receives the A-D converted value of the photomultiplier output in proportion to the count quantity of the digital counter 29 and stores it therein.

Figure 4:
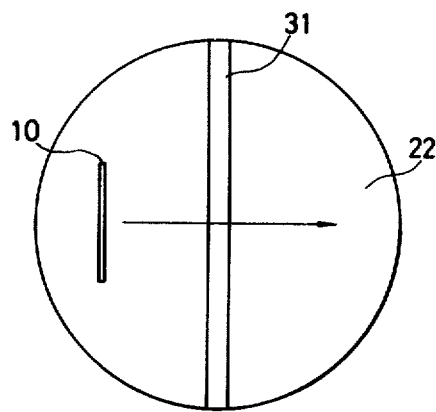
FIG. 4 is a detail view showing an example of a positioning pattern on a wafer projected on a slit.
Figure 5:
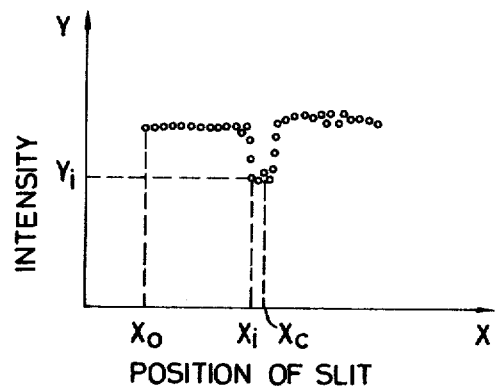
FIG. 5 is a graph showing examples of signals stored in a central processing unit.

FIG. 4 shows an example of the positioning pattern 31 on the wafer projected on the position of the slit 10. FIG. 5 shows examples of the intensity of signals stored in the CPU 30 at this time. The abscissa represents the position X of the slit, while the ordinate represents the A-D converted value Y of the photomultiplier output indicative of the intensity or the brilliance and darkness of the light passing through the slit. The digital value of the photomultiplier output begins to be received at a position $X_o$ at which the pulse from the origin sensor is received. When data is received in proportion to the count quantity of the digital counter 29, the input data at the i-th count value $X_i$ becomes $Y_i$. By processing the signals shown in FIG. 5 and evaluating the position $X_c$ of the slit indicative of the center of the positioning pattern 31 on the wafer, the distance of movement of the slit 10 from the origin thereof is obtained.

The central coordinates of the positioning pattern on the wafer as included in this output signal can be evaluated with, for example, the following method (refer to U.S. Pat. No. 4,115,762). An arbitrary position $X_i$ of the slit is supposed as a tentative center, and data on both the sides thereof amounting to 2.m is superposed to calculate $Z_i$. Here, letting $Y_i$ denote an output signal at the position $X_i$, $Z_i$ is calculated as follows:

$$Z_i = \sum_{j=1}^{m} (Y_{i+j} - Y_{i-j})^2$$

Among the changes of Z thus obtained, a point which gives the minimum value of Z becomes the central position of the pattern on the wafer.

In this manner, the positioning pattern on the wafer is magnified and focused through the optical lens, and the focal plane is scanned by the slit having its mechanical origin on the body of the system so as to photoelectrically detect the intensity of the light passing through the slit in accordance with the position of the movement of the slit, thereby to measure the position of the wafer relative to the body with a high precision, whereupon the wafer and the reticle positioned to the body with the separate detecting optical system are aligned by movement of the reticle, for example, in the manner described in U.S. Pat. No. 4,153,371.

As set forth above, according to this invention, the position of the positioning pattern on the wafer is detected in the position in which the pattern is magnified and projected by the optical system of simple construction including the reduction lens, whereby a high-precision positional detection has become possible. Experiments have revealed that the detection and reproduction precision of the positioning pattern on the wafer in accordance with this invention is enhanced to double the same precision in the system shown in FIG. 1.

While we have shown and described an embodiment in accordance with the present invention, it is understood that the same is not limited thereto but is susceptible of numerous changes and modifications as are known to those skilled in the art, and we therefore do not wish to be limited to the details shown and described herein but intend to cover all such changes and modifications known to one of ordinary skill in the art.

What is claimed is:

1. In a reduction projection aligner system wherein a pattern on a reticle is formed directly on a wafer by reducing and projecting the pattern on the wafer through a reduction projection lens; the improvement comprising means to optically magnify and project and then focus a positioning pattern provided on the wafer onto a focal plane, means to scan the focal plane with a slit, an origin sensor provided with a mechanical origin on a body of said system for determining the initial position of said slit, means to measure the distance from the mechanical origin to said positioning pattern provided on said wafer on the basis of the extent of movement of said slit necessary to align said slit with said positioning pattern to thereby determine the position of said wafer relative to the body of said system, and means to relatively move and position the reticle so as to cause it to coincide with the position of said wafer on the basis of the measurement by said distance measuring means.

2. A reduction projection aligner system as defined in claim 1, wherein said optical means is constructed of an optical system which includes a single light guide.

3. A reduction projection aligner system as defined in claim 1 or claim 2, wherein said distance measuring means includes means to photoelectrically convert the intensity of light passing through said slit in accordance with the movement of said slit, thereby to measure the distance from the mechanical origin of said slit to said positioning pattern on said wafer.

4. A reduction projection aligner system as defined in claim 1 or claim 2, wherein said distance measuring means includes means to measure the distance from the origin of said slit to said positioning pattern on said wafer by the use of an origin sensor which is disposed on said supporting body of said reduction projection aligner system and within the movable range of said slit.

5. In a reduction projection aligner system wherein a primary pattern on a recticle is formed directly on a wafer having a positioning pattern thereon by reducing, projecting and printing the primary pattern on the wafer, both the reticle and the wafer being adjustably supported on a common supporting body, the improvement comprising optical means to optically magnify and project and then focus the wafer positioning pattern onto a focal plane, means to scan the focal plane with a slit, means to measure the distance from a mechanical origin provided on said supporting body of said system to said positioning pattern on said wafer on the basis of the extent of movement of said slit necessary to align said slit with said positioning pattern, and means to relatively move and position the reticle so as to cause it to coincide with the position of said wafer relative to said body of said system on the basis of the measurement by said distance measuring means.

* * * * *